(12) United States Patent
Nakata et al.

(10) Patent No.: US 9,779,951 B2
(45) Date of Patent: Oct. 3, 2017

(54) METHOD FOR MANUFACTURING SEMICONDUCTOR DEVICE

(71) Applicant: Mitsubishi Electric Corporation, Tokyo (JP)

(72) Inventors: Kazunari Nakata, Tokyo (JP); Yoshiaki Terasaki, Tokyo (JP); Masatoshi Sunamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 8 days.

(21) Appl. No.: 15/132,283

(22) Filed: Apr. 19, 2016

(65) Prior Publication Data
US 2017/0076948 A1    Mar. 16, 2017

(30) Foreign Application Priority Data
Sep. 15, 2015 (JP) ................. 2015-182083

(51) Int. Cl.
*H01L 21/28* (2006.01)
*H01L 21/288* (2006.01)
*H01L 21/3213* (2006.01)
*H01L 21/768* (2006.01)
*H01L 29/66* (2006.01)

(52) U.S. Cl.
CPC ...... *H01L 21/288* (2013.01); *H01L 21/32136* (2013.01); *H01L 21/7685* (2013.01); *H01L 29/66348* (2013.01)

(58) Field of Classification Search
CPC ................... H01L 21/88; H01L 29/66348
See application file for complete search history.

(56) References Cited

U.S. PATENT DOCUMENTS

| 6,028,011 A * | 2/2000 | Takase | H01L 24/14 257/E23.021 |
| 8,338,954 B2 * | 12/2012 | Fujiwara | H01L 24/03 257/750 |
| 2006/0046088 A1 * | 3/2006 | Akram | H01L 21/288 428/620 |

(Continued)

FOREIGN PATENT DOCUMENTS

| JP | 09-326395 A | 12/1997 |
| JP | 2010-205991 A | 9/2010 |

(Continued)

*Primary Examiner* — Caridad Everhart
*Assistant Examiner* — Ankush Singal
(74) *Attorney, Agent, or Firm* — Studebaker & Brackett PC

(57) ABSTRACT

A method for manufacturing a semiconductor device includes: forming a first major electrode on a first major surface of a semiconductor substrate; forming a second major electrode on a second major surface of the semiconductor substrate opposite to the first major surface; carrying out a surface activating treatment to activate surfaces of the first and second major electrodes; carrying out a surface cleaning treatment to clean up the surfaces of the first and second major electrodes; and after the surface activating treatment and the surface cleaning treatment, simultaneously forming first and second Ni films on the first and second major electrodes respectively by a wet film forming method, wherein a ratio of crystalline Ni contained in the first and second Ni films is 2% or more.

14 Claims, 11 Drawing Sheets

(56) References Cited

U.S. PATENT DOCUMENTS

| | | | |
|---|---|---|---|
| 2006/0125075 A1* | 6/2006 | Liao | H01L 21/561 |
| | | | 257/690 |
| 2011/0256668 A1 | 10/2011 | Urano | |
| 2013/0248157 A1* | 9/2013 | Zheng | C23C 18/1616 |
| | | | 165/133 |
| 2015/0206998 A1* | 7/2015 | Kapur | H01L 31/02167 |
| | | | 136/256 |

FOREIGN PATENT DOCUMENTS

| | | |
|---|---|---|
| JP | 2011-222898 A | 11/2011 |
| JP | 2013-194291 A | 9/2013 |

\* cited by examiner

METHOD FOR MANUFACTURING SEMICONDUCTOR DEVICE

BACKGROUND OF THE INVENTION

Field

The present invention relates to a method for manufacturing a semiconductor device.

Background

A power semiconductor device (power device) such as an IGBT (insulating gate type bipolar transistor) and a MOSFET (MOS-type field-effect transistor) is widely used as an inverter circuit for an industrial motor, a motor for automobile, and the like, a power supply for a large capacity server, and a semiconductor switch of an uninterruptible power supply, for example.

In a front and back conductive power semiconductor device, a semiconductor substrate is made thin in order to improve an energizing performance as typified by the on-characteristic. Recently, in order to improve the cost performance and characteristics, a semiconductor device is manufactured by means of an ultra-thinning wafer process which makes a wafer thin on the order of 50 μm from a wafer material produced by a FZ (Floating Zone) method.

On the other hand, when such a front and back conductive power semiconductor device is mounted on a circuit board, the power semiconductor device has been electrically connected to the circuit board by soldering the back side surface thereof on the circuit board and wire bonding the front side surface thereof by an Al wire. In recent years, thanks to the improvement of energizing performance of a power semiconductor device, the configuration is emerging which improves energizing performance and heat radiation capability of a power semiconductor module to which a power semiconductor device is incorporated by soldering both the surfaces. Therefore, an Ni (nickel) film at several μm (micron) level for soldering is required to be provided on an electrode layer which is formed on the front surface side of the power semiconductor device. A vacuum film forming method such as deposition or spattering has a low film forming rate, and thus still has a problem of productivity and manufacturing cost. Therefore, plating which is a wet film forming method capable of forming a film at a high speed is attracting attention.

However, due to the trend of thinning of a wafer and thickening of the film thickness of an electrode described above, the problem arises that warpage of a wafer occurs during a wafer process. Specifically, if a wafer edge comes into contact with an unexpected location while handling a wafer, chipping or breakage of the wafer occurs. This causes a problem of deterioration in yield, resulting in increase in manufacturing cost.

In order to prevent the warpage of a wafer, the following technique has been offered (see Japanese Patent Laid-Open No. 2011-222898, for example). When a back electrode is formed on the back surface of the semiconductor wafer by means of vacuum film formation, the semiconductor wafer is in such a state as deflected to protrude to the front surface side due to the stress based on the difference in temperature at the time of forming a film of the back electrode. Next, the back surface of the semiconductor wafer is subjected to a plasma treatment to remove deposits which have been deposited on the back surface of the semiconductor wafer. Then, in order to prevent the back electrode from being contaminated and suppress warpage of the wafer at the time of plating treatment, a peeling tape is stuck on the back surface of the semiconductor wafer along the warpage of the semiconductor wafer. The semiconductor wafer is kept in a state of being deflected to protrude to the front surface side even after the peeling tape is stuck. Next, a plating film is formed on the front surface of the semiconductor wafer by means of electroless plating treatment. Then, the peeling tape is peeled off from the semiconductor wafer. After that, a semiconductor chip is cut out from the semiconductor wafer.

However, in the technique disclosed in Japanese Patent Laid-Open No. 2011-222898, it is difficult to manage manufacturing conditions for maintaining the quality stably, such as a condition for forming a film, a condition for sticking a tape, etc. Furthermore, in order to protect the back electrode, the number of processes is increased by adding the stages of sticking and peeling off a tape to and from a wafer. This inevitably increases the number of handling the wafer, thereby increasing the possibility of breakage of a wafer resulted therefrom. Furthermore, if there is the remaining tape material on the back electrode after the tape is peeled off, the defective rate at the time of assembling also increases. For these reasons, the problem exists that it is difficult to reduce the manufacturing cost.

SUMMARY

The present invention is made to solve the problems described above, and the object thereof is to provide a method for manufacturing a semiconductor device which can suppress warpage of a wafer, reduce the manufacturing cost, and thus achieve a highly-conductive Ni film.

According to the present invention, a method for manufacturing a semiconductor device includes: forming a first major electrode on a first major surface of a semiconductor substrate; forming a second major electrode on a second major surface of the semiconductor substrate opposite to the first major surface; carrying out a surface activating treatment to activate surfaces of the first and second major electrodes; carrying out a surface cleaning treatment to clean up the surfaces of the first and second major electrodes; and after the surface activating treatment and the surface cleaning treatment, simultaneously forming first and second Ni films on the first and second major electrodes respectively by a wet film forming method, wherein a ratio of crystalline Ni contained in the first and second Ni films is 2% or more.

In the present invention, the Ni films are simultaneously formed on the first and second major electrodes respectively. Therefore, it is possible to suppress warpage of a wafer and reduce manufacturing cost. Furthermore, the ratio of crystalline Ni contained in the Ni films is 2% or more, thus Ni film having high conductivity can be obtained.

Other and further objects, features and advantages of the invention will appear more fully from the following description.

DESCRIPTION OF EMBODIMENTS

A method for manufacturing a semiconductor device according to the embodiments of the present invention will be described with reference to the drawings. The same components will be denoted by the same symbols, and the repeated description thereof may be omitted.

Embodiment 1

Figure 1:
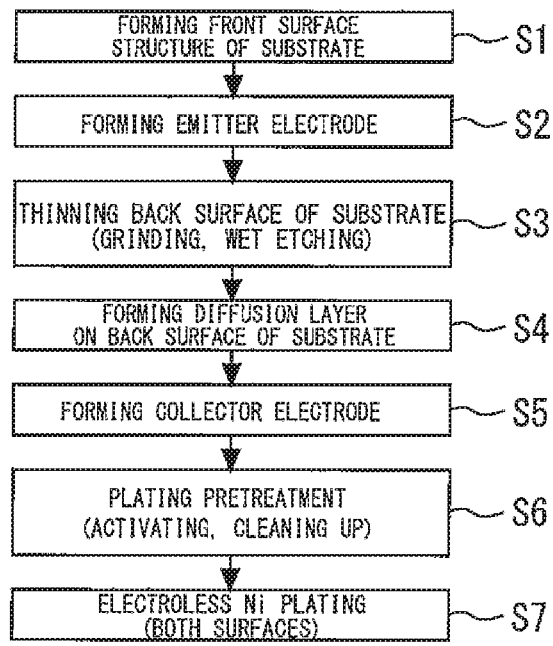
FIG. 1 is a flow chart of a method for manufacturing a semiconductor device according to Embodiment 1 of the present invention.

FIG. 1 is a flow chart of a method for manufacturing a semiconductor device according to Embodiment 1 of the present invention. FIGS. 2 to 6 are cross sectional views showing stages for manufacturing a semiconductor device according to Embodiment 1 of the present invention. In this embodiment, as an example of a front and back conductive semiconductor device, electrodes for soldering are formed on the front and back surfaces of a trench type IGBT (insulated gate type bipolar transistor).

Figure 2:
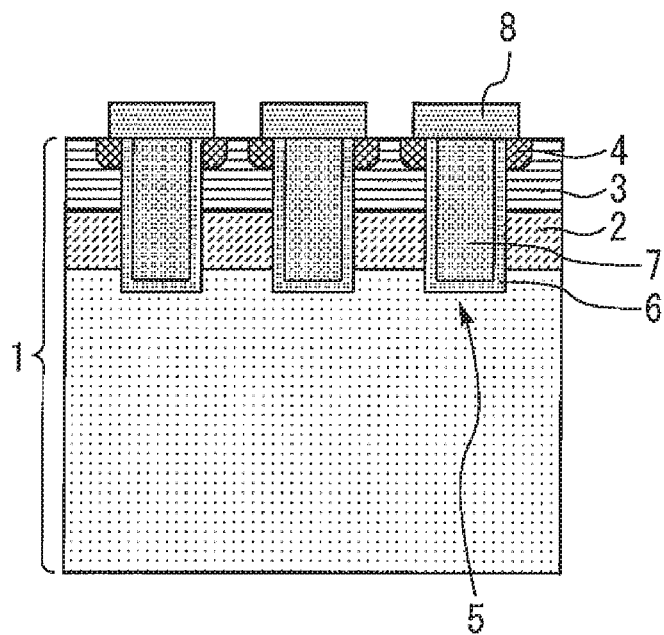
FIGS. 2 to 6 are cross sectional views showing stages for manufacturing a semiconductor device according to Embodiment 1 of the present invention.

First, as shown in FIG. 2, the structure on the front surface side of the semiconductor substrate 1 is formed (step S1). More specifically, an ion such as phosphorus or arsenic is implemented from the front surface side (the upper side of the figure) of an n-type semiconductor substrate 1, and an n-type charge storage layer 2 is formed by executing heat treatment by an activation furnace. Likewise, a p-type base layer 3 is formed by implementing boron or boron difluoride ($BF_2$). Likewise, an n-type emitter layer 4 is formed in a part of the p-type base layer 3 by implementing phosphorus or arsenic.

Next, photolithography and dry etching are applied to the front surface side of the semiconductor substrate 1 to form a trench 5 which penetrates the n-type emitter layer 4, the p-type base layer 3, and n-type charge storage layer 2. The trench 5 has the cross sectional shape continuing alike in the depth direction of the figure. Next, a gate insulation film 6 of about 100 nm, for example, is formed along the inner wall of the trench 5 by thermal oxidation, etc. Then, polysilicon is embedded into the trench 5 to form a trench gate 7. Next, an interlayer insulation film 8 is formed on the trench gate 7 by CVD (Chemical Vapor Deposition), etc. In order to make contact with the electrode, the unnecessary interlayer insulation film 8 is removed by photolithography, dry etching, or wet etching, etc. In this manner, the front surface structure of the semiconductor substrate 1 is formed.

Figure 3:
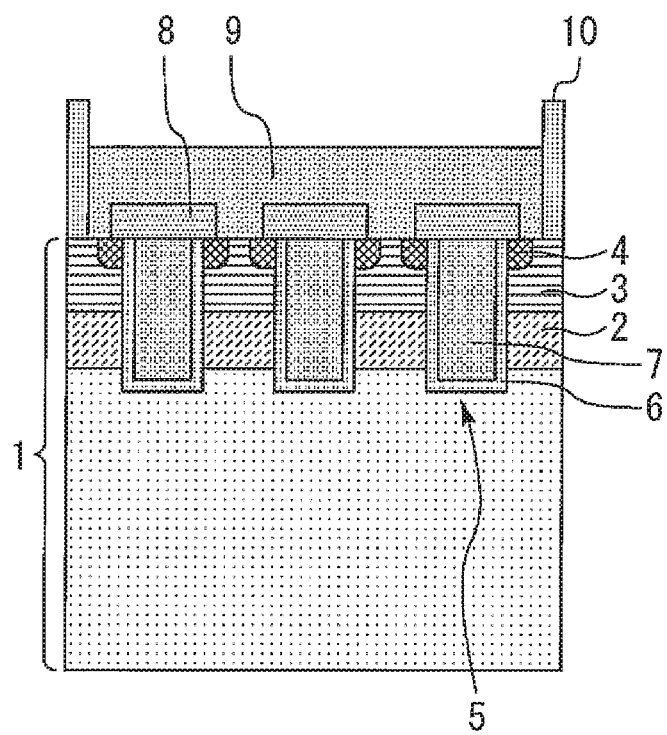

Next, as shown in FIG. 3, an emitter electrode 9 of about 5 μm is formed on the front surface of the semiconductor substrate 1 by vacuum deposition method or spattering method, etc (step S2). The emitter electrode 9 is electrically connected to the p-type base layer 3 and the n-type emitter layer 4. Pure Al, an AlSi alloy, an AlCu alloy, or an AlSiCu alloy can be used as a material of emitter electrode 9. However, the density of Si or Cu in Al of the emitter electrode 9 is 5 wt % or less. Furthermore, a phenomenon of so-called Al spike may occur in which mutual diffusion of atoms is generated between Al in the emitter electrode 9 and Si or SiC of the semiconductor substrate 1, resulting in Al protruding on the substrate side. Then, the emitter electrode 9 may take the form of a laminated structure employing a metal film of Ti, Mo, W, V, and Cr, etc., as barrier metal provided between the semiconductor substrate 1 and the Al alloy.

Furthermore, a protective film 10 is formed for covering the circumference of the emitter electrode 9. The protective film 10 is provided for the purpose of protecting the surface of the semiconductor device and ensuring the insulation distance from the outside. An inorganic matter such as $SiO_2$ (silicon oxide film) or SiN (silicon nitride film), or an organic matter such as polyimide can be used as a material of the protective film 10. The thickness thereof is mainly from 1 μm to 10 μm, and may be about 50 μm for ensuring the insulation from the outside.

Figure 4:
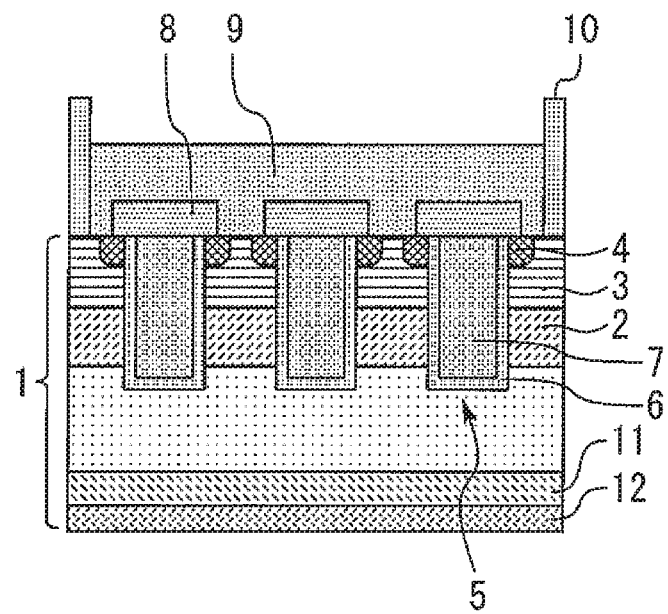

Next, as shown in FIG. 4, the back surface of the semiconductor substrate 1 is thinned to an appropriate thickness by machining by means of a grinding stone and wet etching containing hydrofluoric acid or nitric acid (step S3). Then, an n-type buffer layer 11 and a p-type collector layer 12 are subsequently formed by ion implementation from the back surface side of the semiconductor substrate 1 (the lower side of the figure) and heat treatment (step S4). In addition, the emitter electrode 9 formed on the front surface the semiconductor substrate 1 has a low melting point, and thus heating to the temperature of about 1000° C. using a diffusion furnace exceeds the melting point of the emitter electrode 9. Therefore, in the heat treatment for forming the n-type buffer layer 11 and the p-type collector layer 12, laser annealing may be used by which only the back surface can be efficiently heated.

Figure 5:
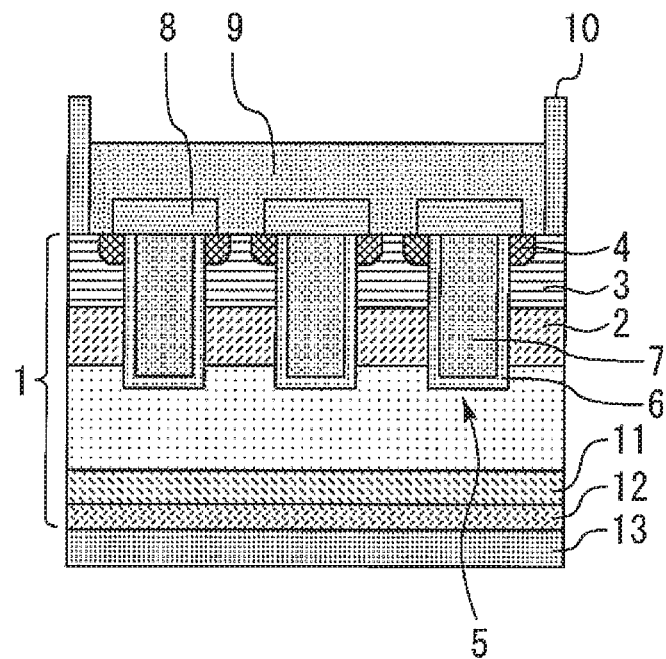

Next, as shown in FIG. 5, a collector electrode 13 is formed on the back surface of the semiconductor substrate 1 (step S5). The collector electrode 13 is electrically connected to the p-type collector layer 12. Pure Al, an AlSi alloy, an AlCu alloy, or an AlSiCu alloy can be used as a material of the collector electrode 13.

Here, strong organic residues and oxide film are formed on the front surfaces of the emitter electrode 9 and collector electrode 13. Accordingly, even if plating is applied after typical degreasing and acid pickling, metal diffusion does not occur between the Al alloy and the plated metal of those electrodes, and thus a plating film having strong adhesion cannot be formed. Then, a plating pretreatment as described below will be carried out (step S6).

Figure 7:
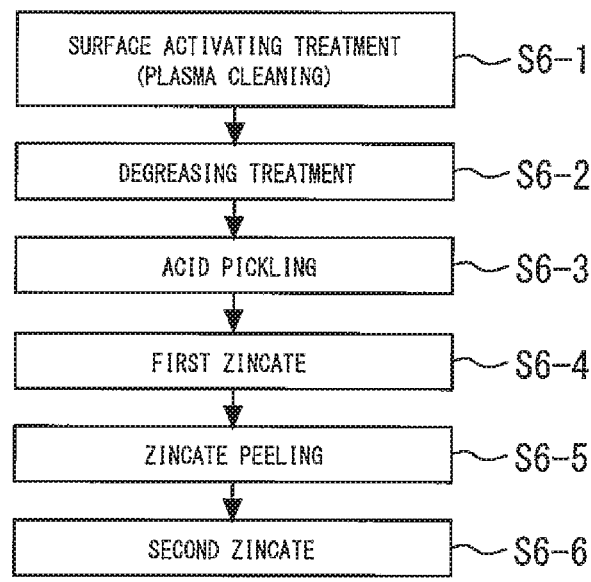
FIG. 7 is a flow chart of a plating pretreatment according to Embodiment 1 of the present invention.

FIG. 7 is a flow chart of a plating pretreatment according to Embodiment 1 of the present invention. First, plasma cleaning utilizing plasma is carried out as a surface activating treatment, for example, (step S6-1). The plasma cleaning is a treatment method in which organic residues baked on the Al alloy which cannot be removed by a typical plating pretreatment is oxidatively decomposed by plasma or driven out so as to clean up the front surface.

Next, degreasing treatment is carried out for removing organic contaminants mildly remaining on the front surface of the Al alloy, as well as the oxide film (step S6-2). Next, the front surface of the Al alloy is neutralized, and the front surface is etched to roughen the surface, then, the acid pickling is carried out so that the reactivity of treatment solution at the subsequent stage to improve the adhesion of plating (step S6-3).

Next, the front surfaces of the Al alloy of the emitter electrode 9 and the collector electrode 13 are subjected to a first zincate treatment which forms a Zn (zinc) coating while removing the oxide film of Al (step S6-4). Specifically, when the Al alloy is immersed in a water solution in which Zn is dissolved as ions, Al is dissolved as ions due to Zn having nobler standard oxidation-reduction potential than Al. Due to electrons generated at this time, Zn ions receive the electrons on the front surface of the Al alloy so that the Zn coating is formed on the front surface of the Al alloy. The Al oxide film is also removed here.

Next, zincate peeling is carried out in which the Al alloy coated with Zn is immersed in concentrated nitric acid to dissolve Zn, and also a thin and even Al oxide coating is formed on the front surface of Al (step S6-5). Next, a second zincate treatment is carried out in which the Al alloy is again immersed in the Zn treatment solution, so that Zn (zinc) coating is formed on the front surface of the Al alloy while removing the Al oxide film (step S6-6). These treatments make the Al alloy thin and smooth. The larger the number of treatments increases, the more the front surface of the Al alloy becomes even, resulting in the improvement of the quality of the plating film. Nevertheless, twice or three times is preferable when considering the productivity.

In this manner, the plating pretreatment is carried out. The difference from the typical plating pretreatment is that the plasma cleaning, the zincate treatment, and the zincate peeling are included as stages. In addition, sufficient water washing time is ensured between respective stages so as not to bring the treatment solution and residues in the previous stage in the next stage.

Figure 6:
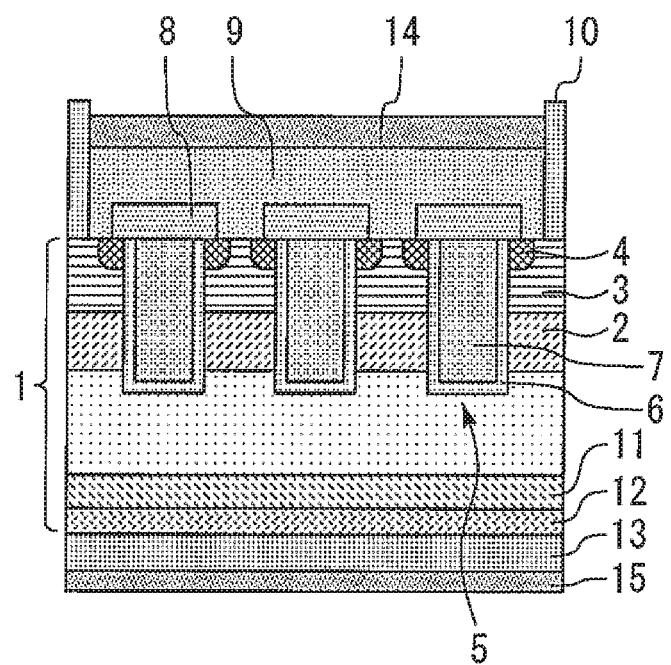

Next, as shown in FIG. 6, electroless Ni plating films 14 and 15 are simultaneously formed on the emitter electrode 9 on the front surface of the substrate and the collector electrode 13 the back surface of the substrate respectively by carrying out electroless Ni plating (step S7). Specifically, when the Zn-coated Al alloys of the emitter electrode 9 and the collector electrode 13 are immersed in an electroless Ni plating solution, Ni is deposited on the Al alloy in the first place because Zn has baser standard oxidation-reduction potential than Ni. Subsequently, when the front surface is coated with Ni, Ni is deposited in an automatically catalytic manner by the action of reducing agent contained in the plating solution. However, since ingredients of the reducing agent are introduced into the plating film at the time of such an automatically catalytic deposition, the electroless Ni plating films 14 and 15 becomes alloys, and becomes amorphous if the density of the reducing agent is high. Since hypophosphorous acid is generally utilized as the reducing agent, the electroless Ni plating films 14 and 15 contain P. Under the condition described above, the electroless Ni plating film 14 of 5.0 µm is formed on the emitter electrode 9, and the electroless Ni plating film 15 of 4.8 µm is formed the collector electrode 13. Furthermore, the density of P in the electroless Ni plating films 14 and 15 is 5.5 wt %, and the presence of crystalline Ni has been confirmed by X-ray diffraction.

Figure 8:
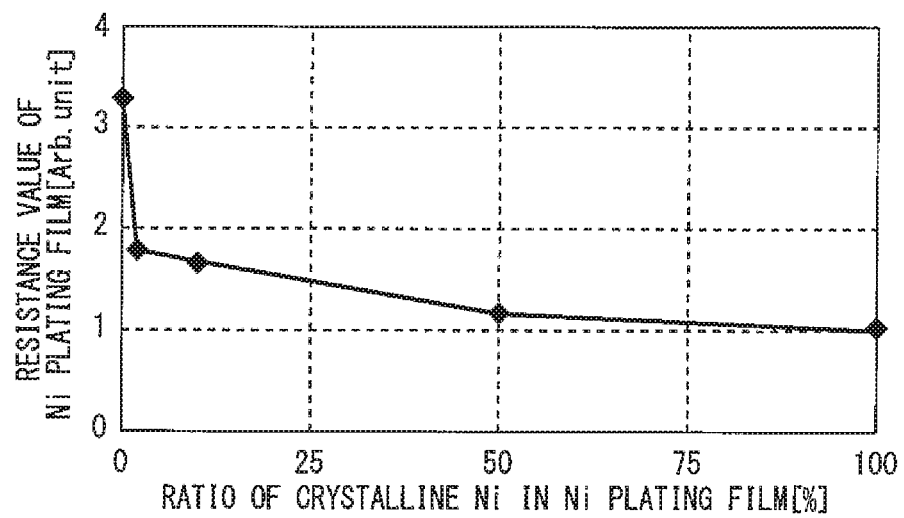
FIG. 8 is figure showing the relationship between the ratio of the crystalline Ni in the Ni plating film and the resistance value of the Ni plating film.
Figure 9:
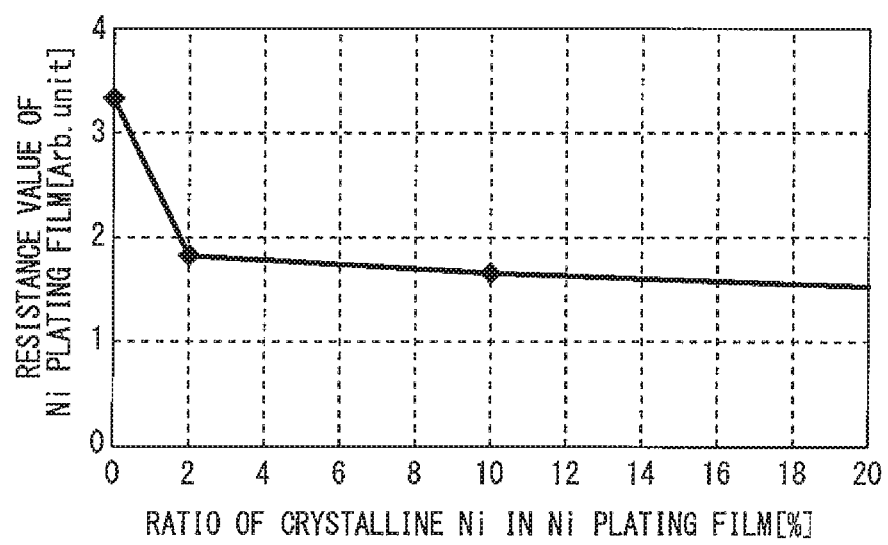
FIG. 9 is a figure in which a part of the horizontal axis in FIG. 8 is enlarged.

FIG. 8 is figure showing the relationship between the ratio of the crystalline Ni in the Ni plating film and the resistance value of the Ni plating film. FIG. 9 is a figure in which a part of the horizontal axis in FIG. 8 is enlarged. The resistance value in the case of only the Ni plating film has been investigated by the comparison with a sample in which the Ni plating film is not formed using the trench IGBT as shown in FIG. 6. As a result, it has been confirmed that, when the ratio of crystalline Ni contained the Ni plating film is set to 2% or more, the resistance value of the Ni plating film has decreased and the conductivity thereof has been improved. Furthermore, in this experiment, the density of P contained in the electroless Ni plating film was changed, so that the ratio of crystalline Ni contained in the electroless Ni plating film was changed. The ratio of crystalline Ni can be adjusted as appropriate by heating by the heat treatment the entire wafer on which the semiconductor device after forming the electroless Ni plating film.

As described above, in this embodiment, the electroless Ni plating films 14 and 15 are simultaneously formed on the emitter electrode 9 on the front surface of the substrate and the collector electrode 13 on the back surface of the substrate respectively. This makes it possible to suppress warpage of a wafer at the time of forming the plating film. Furthermore, applying wet film forming by plating to both the surfaces simultaneously makes the stages of applying and peeling a tape unnecessary. Therefore, the possibility of breakage of a wafer at the time of handling a wafer can be reduced. Furthermore, it is possible to reduce the number of processes along with applying a tape, and also reduce the amount of energy consumption at the time of manufacturing. Therefore, it is possible to suppress warpage of a wafer and also reduce manufacturing cost. Furthermore, the ratio of crystalline Ni contained in the electroless Ni plating films 14 and 15 is set to 2% or more, so that the Ni film having high conductivity can be obtained.

Furthermore, the plasma cleaning is carried out as the surface activating treatment, so that it is possible to activate both the front and back surface of the semiconductor substrate 1 simultaneously in a noncontact manner. Furthermore, the zincate treatment is carried out as the surface cleaning treatment, so that it is possible to form the electroless Ni plating films 14 and 15 evenly. Furthermore, the zincate treatment is carried out at least twice, so that it is possible to make the thickness of the electroless Ni plating films 14 and 15 even. Furthermore, the electroless Ni plating films 14 and 15 can be formed with a simple equipment constitution by using the electroless Ni plating.

Furthermore, before forming the electroless Ni plating films 14 and 15, the circumference of the emitter electrode 9 is surrounded by the protective film 10 on the front surface of the semiconductor substrate 1. This makes it possible to form the electroless Ni plating films 14 and 15 only on the portion required for the assembly, and thus suppress the variation in characteristics due to dispersion of solder materials on the periphery of the chip.

Furthermore, if the emitter electrode 9 and the collector electrode 13 are the Al alloy electrodes, it is possible to establish a reliable connection to the semiconductor substrate 1. Furthermore, it is preferable that each of these electrodes have a barrier metal and an Al alloy electrode provided on the barrier metal. This makes it possible to establish a reliable electric connection while suppressing an aluminum spike due to the mutual diffusion of the Al alloy and Si even if these electrodes are bonded to the semiconductor substrate 1 to be subjected to heat treatment. Otherwise, the structure may be employed in which each of these electrodes has an Al alloy electrode and a barrier metal provided on the Al alloy electrode. This makes it possible to suppress the erosion of Al due to the zincate treatment.

Embodiment 2

Figure 10:
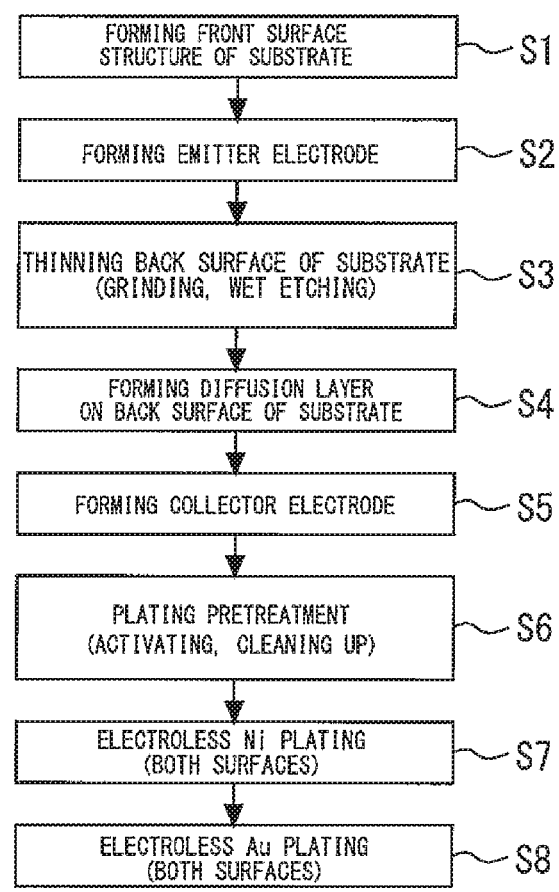
FIG. 10 is a flowchart of a manufacturing method of a semiconductor device according to Embodiment 2 of the present invention.
Figure 11:
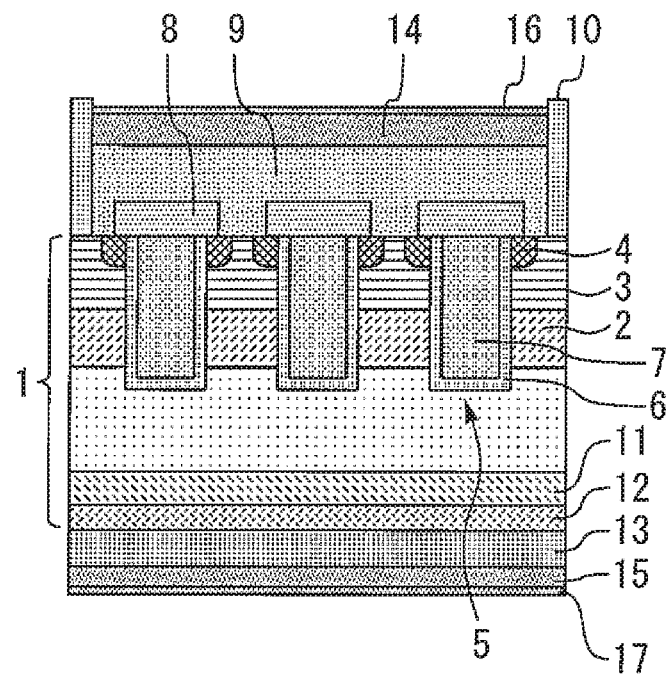
FIG. 11 is a cross sectional view showing manufacturing stages of a semiconductor device according to Embodiment 2 of the present invention.

FIG. 10 is a flowchart of a manufacturing method of a semiconductor device according to Embodiment 2 of the present invention. FIG. 11 is a cross sectional view showing manufacturing stages of a semiconductor device according to Embodiment 2 of the present invention. First, step S1 to S7 are carried out similar to Embodiment 1. Then, as shown in FIG. 11, electroless Au plating films 16 and 17 are formed on the electroless Ni plating films 14 and 15, respectively, by means of substitution type electroless Au plating (step S8). The substitution type electroless Au plating is to be applied on the electroless Ni plating films 14 and 15, and utilizes the action of substitution of Ni and Au by the action of a complexing agent contained in the plating solution. When the Ni front surface is coated with Au, the reaction is stopped because of the substitution type. Therefore, it is difficult to form a thick film; the thickness of the film may be 0.1 μm at the maximum, and often about 0.05 μm in general. However, the values of thickness of the Au plating described above are not too small when utilized for soldering.

In this manner, the electroless Ni plating film 14 of 5.0 μm and the electroless Au plating film 16 of 0.05 μm are formed on the emitter electrode 9, and the electroless Ni plating film 15 of 4.8 μm and the electroless Au plating film 17 of 0.05 μm are formed on the collector electrode 13. Furthermore, the density of P in the electroless Ni plating films 14 and 15 is 5.5 wt %, and the presence of crystalline Ni has been confirmed by X-ray diffraction.

Figure 12:
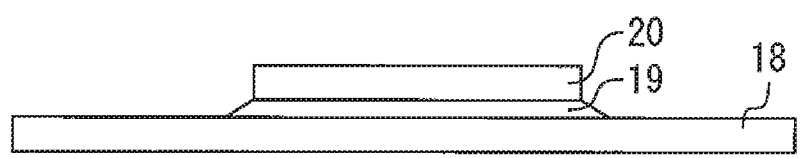
FIG. 12 is a cross sectional view showing the state where the semiconductor device according to Embodiment 2 of the present invention is soldered on a circuit board.
Figure 13:
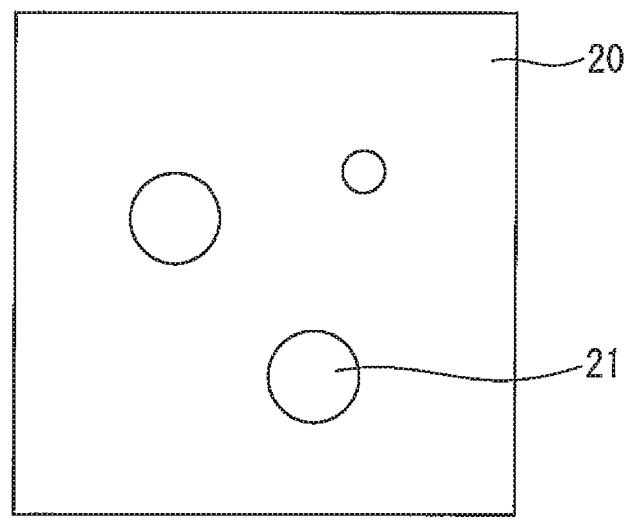
FIG. 13 is a plan view showing a solder bonding interface of FIG. 12.

FIG. 12 is a cross sectional view showing the state where the semiconductor device according to Embodiment 2 of the present invention is soldered on a circuit board. FIG. 13 is a plan view showing a solder bonding interface of FIG. 12. When a semiconductor device 20 is soldered on a circuit board 18 using solder 19, solder void 21 is generated depending on solder wettability on the back surface side of the semiconductor device 20.

In contrast, in this embodiment, the electroless Au plating films 16 and 17 are formed on the electroless Ni plating films 14 and 15, respectively, so that it is possible to suppress oxidation of the electroless Ni plating films 14 and 15, thereby preventing the generation of voids at the time of soldering. Furthermore, the electroless Au plating films 16 and 17 can be formed with a simple equipment constitution by using the electroless Au plating.

Figure 14:
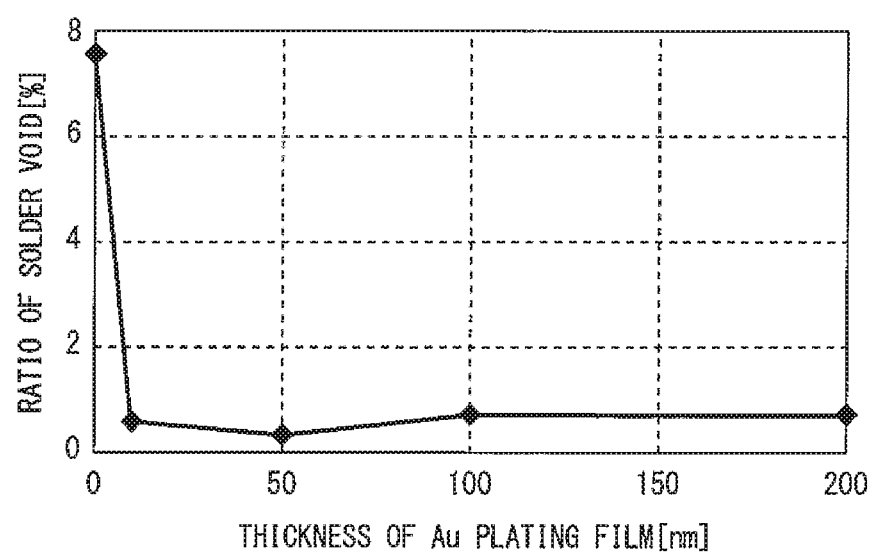
FIG. 14 is a figure showing the relationship between the thickness of the Au plating film of the semiconductor device according to Embodiment 2 of the present invention and the ratio of solder void with respect to the area of the semiconductor device.
Figure 15:
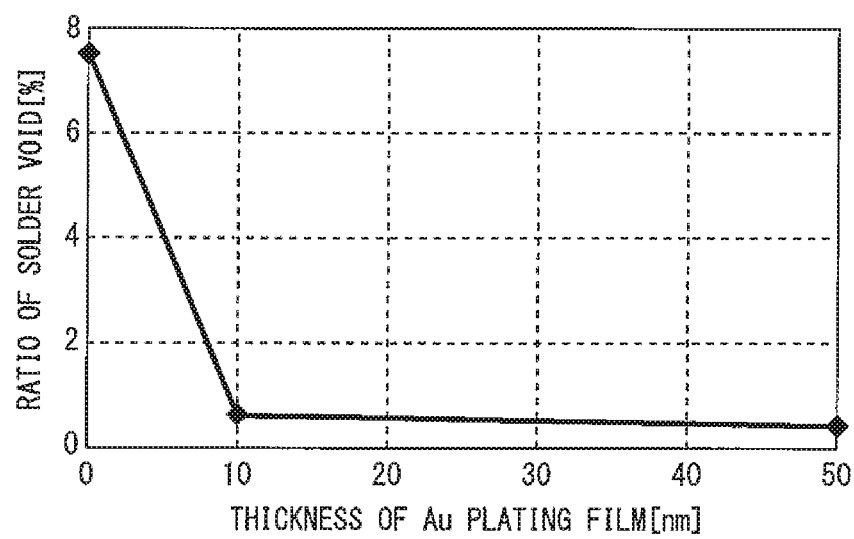
FIG. 15 is a figure in which a part of the horizontal axis in FIG. 14 is enlarged.

FIG. 14 is a figure showing the relationship between the thickness of the Au plating film of the semiconductor device according to Embodiment 2 of the present invention and the ratio of solder void with respect to the area of the semiconductor device. FIG. 15 is a figure in which a part of the horizontal axis in FIG. 14 is enlarged. FIGS. 14 and 15 reveal that the thickness of the Au plating film is set to 10 nm or more, so that it is possible to significantly reduce the ratio of solder void after soldering. In this case, Sn-3.0% Ag-0.5% Cu was used as a material of the solder 19. The electroless Au plating films 16 and 17 are formed on the electroless Ni plating films 14 and 15, so that it is possible to suppress the deterioration in solder wettability due to Ni diffused to the most front surface leading to oxidation of Ni. Therefore, high solder wettability at the time of soldering can be maintained and the soldering operation is facilitated, so that the effect of reduction in manufacturing cost and improvement of reliability can be also expected.

In addition, the solder material is not limited to the Sn—Ag—Cu based material described above, but may be Sn—Cu based, Sn—Zn—Bi based, Sn—Bi—Cu based, Sn—Bi—Cu—Ni based, Sn—Sb based, Sn—Cu—Ni based, or Sn—Ag—Cu—Ni based material. This embodiment can reduce the ratio of void with respect to those solder materials.

Embodiment 3

Figure 16:
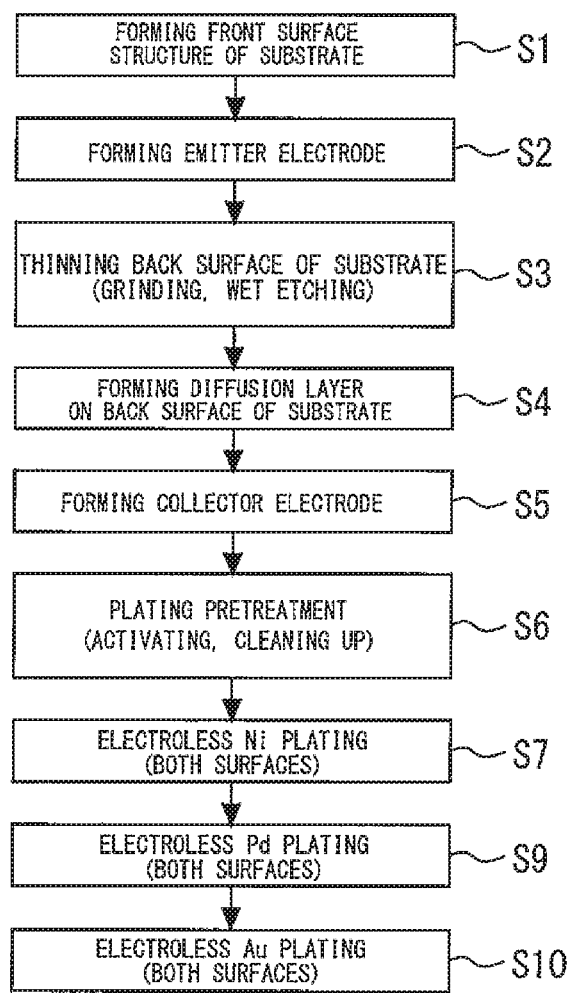
FIG. 16 is a flow chart of a method of manufacturing the semiconductor device according to Embodiment 3 of the present invention.
Figure 17:
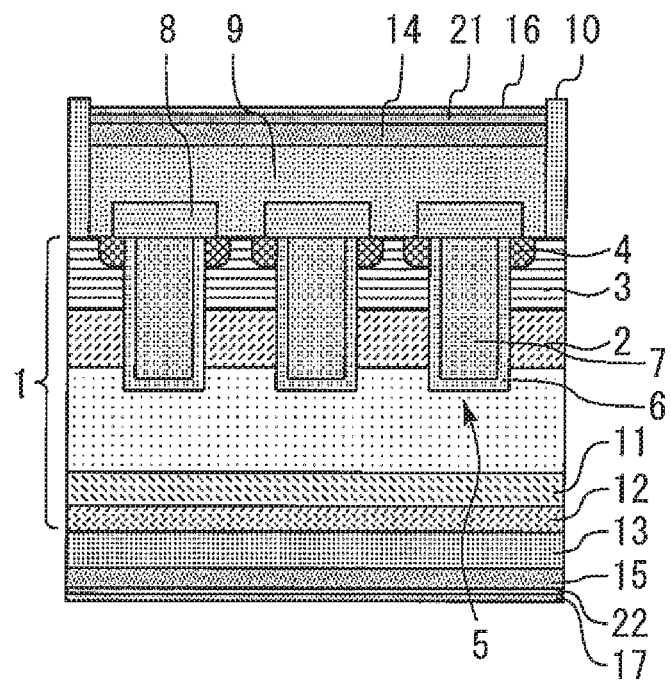
FIG. 17 is a cross sectional view showing the stages of manufacturing the semiconductor device according to Embodiment 3 of the present invention.

FIG. 16 is a flow chart of a method of manufacturing the semiconductor device according to Embodiment 3 of the present invention. FIG. 17 is a cross sectional view showing the stages of manufacturing the semiconductor device according to Embodiment 3 of the present invention. First, steps S1 to S7 are carried out similar to Embodiments 1 and 2. Next, as shown in FIG. 17, electroless Pd plating films 21 and 22 are formed on the electroless Ni plating films 14 and 15, respectively, by electroless Pd plating (step S9). Next, the electroless Au plating films 16 and 17 are formed on the electroless Pd plating films 21 and 22, respectively, by electroless Au plating (step S10).

The electroless Pd plating films 21 and 22 cover the front surfaces of the electroless Ni plating films 14 and 15 to suppress oxidation of Ni, and also can prevent Au in the electroless Au plating films 16 and 17 from being diffused in the electroless Ni plating films 14 and 15. Therefore, high wettability at the time of soldering can be maintained, so that it is possible to suppress the generation of void at the time of soldering. As a result, the soldering operation is facilitated and the manufacturing cost is reduced, thereby enabling the reliability to be improved. Furthermore, the electroless Pd plating films 21 and 22 can be formed with a simple equipment constitution by using the electroless Pd plating. Additionally, the same effect as Embodiments 1 and 2 can be obtained.

In addition, the semiconductor substrate 1 is not limited to that formed of Si (silicon), but may be formed of a wide band gap semiconductor having wider band gap than silicon. The wide band gap semiconductor is SiC (silicon carbide), a gallium nitride material, or a diamond, for example. The semiconductor device formed of such a wide band gap semiconductor can be downsized because it has high voltage resistance and high allowable current density. When such a downsized semiconductor device is used, a semiconductor module in which such a semiconductor device is integrated also can be downsized. Furthermore, since the semiconductor device has high heat resistance property, a radiation fin of a heat sink can be downsized, and air cooling can be employed instead of a water cooling section, thereby enabling the semiconductor module to be further smaller. Furthermore, the semiconductor device has low power loss and high efficiency, and thus the efficiency of the semiconductor module can be improved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-182083, filed on Sep. 15, 2015 including specification, claims, drawings and summary, on which the Convention priority of the present application is based, is incorporated herein by reference in its entirety.

The invention claimed is:

1. A method for manufacturing a semiconductor device comprising:
   forming a first major electrode on a first major surface of a semiconductor substrate;
   forming a second major electrode on a second major surface of the semiconductor substrate opposite to the first major surface;
   carrying out a surface activating treatment to activate surfaces of the first and second major electrodes;
   carrying out a surface cleaning treatment to clean up the surfaces of the first and second major electrodes; and
   after the surface activating treatment and the surface cleaning treatment, simultaneously forming first and second Ni films on the first and second major electrodes respectively by a wet film forming method,
   wherein a ratio of crystalline Ni contained in the first and second Ni films is 2% or more.

2. The method for manufacturing a semiconductor device of claim 1, further comprising forming first and second Au films on the first and second Ni films respectively by a wet film forming method.

3. The method for manufacturing a semiconductor device of claim 1, further comprising:
   forming first and second Pd films on the first and second Ni films respectively by a wet film forming method; and
   forming first and second Au films on the first and second Pd films respectively by a wet film forming method.

4. The method for manufacturing a semiconductor device of claim 1, wherein plasma cleaning is carried out as the surface activating treatment.

5. The method for manufacturing a semiconductor device of claim 1, wherein a zincate treatment is carried out as the surface cleaning treatment.

6. The method for manufacturing a semiconductor device of claim 5, wherein the zincate treatment is carried out at least twice.

7. The method for manufacturing a semiconductor device of claim 1, wherein the wet film forming method for forming the first and second Ni films is electroless Ni plating.

8. The method for manufacturing a semiconductor device of claim 2, wherein the wet film forming method for forming the first and second Au films is electroless Au plating.

9. The method for manufacturing a semiconductor device of claim 3, wherein the wet film forming method for forming the first and second Pd films is electroless Pd plating.

10. The method for manufacturing a semiconductor device of claim 1, further comprising, before forming the first and second Ni films, surrounding a circumference of the first major electrode by a protective film on the first major surface of the semiconductor substrate.

11. The method for manufacturing a semiconductor device of claim 1, wherein at least one of the first and second major electrodes is an Al alloy electrode.

12. The method for manufacturing a semiconductor device of claim 1, wherein at least one of the first and second major electrodes includes a barrier metal and an Al alloy electrode on the barrier metal.

13. The method for manufacturing a semiconductor device of claim 5, wherein at least one of the first and second major electrodes includes an Al alloy electrode and a barrier metal on the Al alloy electrode.

14. The method for manufacturing a semiconductor device of claim 1, wherein the semiconductor substrate is Si or SiC.

* * * * *